United States Patent
Cho

(12) 
(10) Patent No.: US 6,703,848 B2
(45) Date of Patent: Mar. 9, 2004

(54) DIGITALLY CONTROLLED ADAPTIVE DRIVER FOR SENSING CAPACITIVE LOAD

(75) Inventor: Young-Kyun Cho, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 68 days.

(21) Appl. No.: 10/073,471

(22) Filed: Feb. 11, 2002

(65) Prior Publication Data

US 2002/0196035 A1 Dec. 26, 2002

(30) Foreign Application Priority Data

Jun. 26, 2001 (KR) .......................................... 2001-36589

(51) Int. Cl.[7] .......................... G01R 27/26; G06M 1/00; G05F 1/10
(52) U.S. Cl. ..................................... 324/678; 324/76.16
(58) Field of Search ............................ 324/678, 76.79, 324/76.82, 76.83, 76.16; 323/241, 283, 322; 327/111, 107, 142, 151; 365/185.21, 185.23, 185.25

(56) References Cited

U.S. PATENT DOCUMENTS

| | | | | |
|---|---|---|---|---|
| 4,063,146 A | * | 12/1977 | Oliver | 323/241 |
| 5,451,861 A | * | 9/1995 | Giebel | 323/315 |
| 6,130,541 A | * | 10/2000 | Ozguc | 324/678 |
| 6,307,385 B1 | * | 10/2001 | Tardif et al. | 324/678 |

FOREIGN PATENT DOCUMENTS

KR       P2000-0055320       9/2000

* cited by examiner

*Primary Examiner*—Anjan K. Deb
(74) *Attorney, Agent, or Firm*—F. Chau & Associates, LLP

(57) ABSTRACT

A digitally controlled adaptive driver and method for sensing a capacitive load are included. The driver comprises a load sensing circuit for sensing a voltage of an output terminal of the driver connected to a load and for generating a control signal in response to the voltage of the output terminal, and a control driver for digitally determining a value of the load coupled to the output terminal in response to the control signal of the load sensing circuit and for controlling the driving current for driving an input signal in response to the value of the load.

16 Claims, 3 Drawing Sheets

DIGITALLY CONTROLLED ADAPTIVE DRIVER FOR SENSING CAPACITIVE LOAD

CROSS-REFERENCE TO RELATED APPLICATION

This application claims priority to Korean Patent Application No. 2001-36589 filed on Jun. 26, 2001.

BACKGROUND

1. Technical Field

The present invention relates to a semiconductor memory device, and more particularly, to a digitally controlled adaptive driver and method thereof for automatically sensing an unknown load coupled to an output terminal of the driver and digitally controlling the current driving ability of the driver.

2. Description of Related Art

In general, a driver is a component of a semiconductor device that drives applications coupled to an output terminal of the driver at a predetermined data output speed. Such applications generally have a capacitive load. The slew rate of a signal output from the driver is dependent on the value of the capacitive load and an amount of current applied to the capacitive load.

FIG. 1 is a black diagram of an adaptive output driver as disclosed in Korean Patent application No. 98-36292. Referring to FIG. 1, the adaptive output driver comprises a load sensing circuit 210 and a buffer circuit 230. The load sensing circuit 210 senses the load of an output terminal OUT (that is coupled to an external bus line) in response to first and second control signals (UP and DN).

The buffer circuit 230 changes an amount of current flowing to the adaptive output driver in response to the outputs (COUT1 and COUT2) of the load sensing circuit 210, thereby changing the driving ability of the adaptive output driver. Therefore, the adaptive output driver is required to have extra pull-down drivers 21–24 to sense the load coupled to the output terminal OUT of the driver and to control the current flowing to the output terminal OUT.

Further, since the adaptive output driver operates based on an analog method, it is difficult to measure the exact value of the capacitive load coupled to the output terminal. Thus, it is difficult to precisely control the amount of current supplied to the capacitive load. Moreover, it is difficult to design an adaptive output driver operated based on an analog method.

SUMMARY OF THE INVENTION

It is an object of the present invention to provide a digitally controlled adaptive driver that operates based on a digital method and precisely measures the variable value of the capacitive load coupled to an output terminal of the adaptive driver.

It is another object of the present invention to provide a method for driving a driver that precisely measures the variable value of the capacitive load coupled to an output terminal of the driver.

According to one aspect of the present invention, there is provided a digitally controlled adaptive driver comprising a load sensing circuit for sensing a voltage of an output terminal of the driver connected to a load and for generating a control signal in response to the voltage of the output terminal, and a control driver for digitally determining a value of the load coupled to the output terminal in response to the control signal of the load sensing circuit and for controlling a driving current for driving an input signal in response to the value of the load.

In one embodiment, the driver further comprises a charge pumping circuit for supplying a reference current to the output terminal in response to a clock signal.

The load sensing circuit preferably comprises a reference voltage generator for generating a reference voltage, and a comparator for comparing the reference voltage of the reference voltage generator with the voltage of the output terminal and for outputting the comparison result as the control signal. The control signal comprises a first state when the voltage of the output terminal is larger than the reference voltage, and the control signal comprises a second state when the reference voltage is larger than the voltage of the output terminal.

The control driver comprises a counter for counting the number of cycles of a clock signal and for outputting a digital signal corresponding to the number of cycles of the clock signal in response to the control signal having the first state, a digital-to-analog converter (DAC) for converting the digital signal into the driving current, and a driver for driving the input signal into the output terminal in response to the driving current.

According to another aspect of the present invention, it is provided a digitally controlled adaptive driver comprising a charge pumping circuit for supplying a predetermined current to an output terminal of the driver in response to a clock signal, a counter for counting the number of cycles of the clock signal and for outputting a count signal corresponding to the number of counted cycles of the clock signal, a driver for driving an input signal to the output terminal in response to the count signal, and a control signal generator for comparing the voltage of the output terminal with a reference voltage to generate a control signal. The control signal has a first state when the voltage of the output terminal is larger than the reference voltage, and the control signal has the second state when the reference voltage is larger than the voltage of the output terminal. The charge pumping circuit is enabled in response to the second state of the control signal, and the counter outputs the count signal in response to the first state of the control signal.

According to further aspect of the present invention, it is provided a method for driving a signal. The method comprises the steps of sensing a voltage of an output terminal connected to a load, generating a control signal based on the sensed voltage, digitally measuring the load in response to the control signal, and adaptively controlling a driving current in response to the value of the load to drive an input signal to the output terminal.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
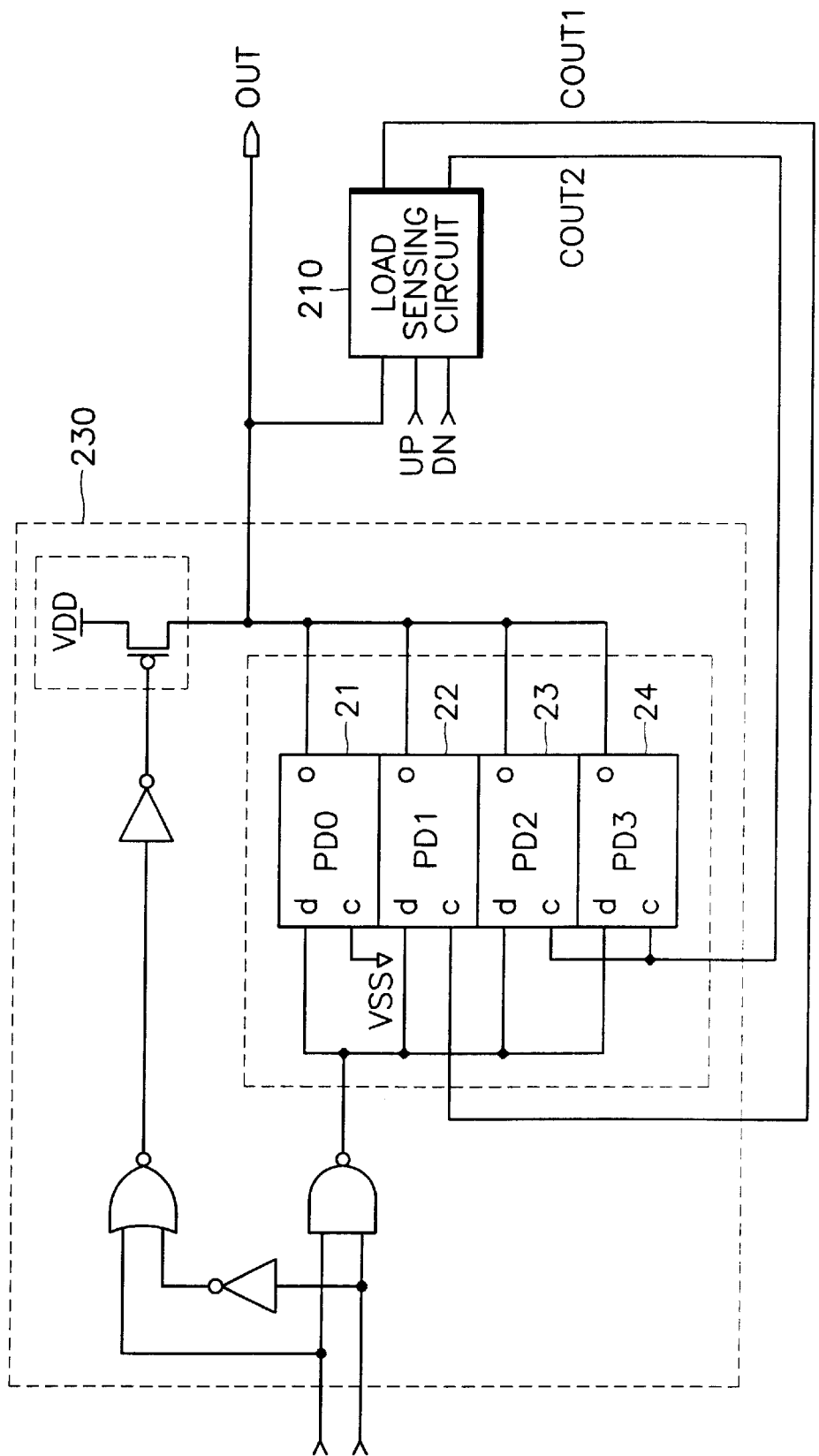
FIG. 1 is a block diagram of an analog adaptive output driver.

The present invention will be described more fully hereinafter with reference to the accompanying drawings in which preferred embodiments of the invention are shown, wherein similar reference numerals denote elements having the same or similar functions.

Figure 2:
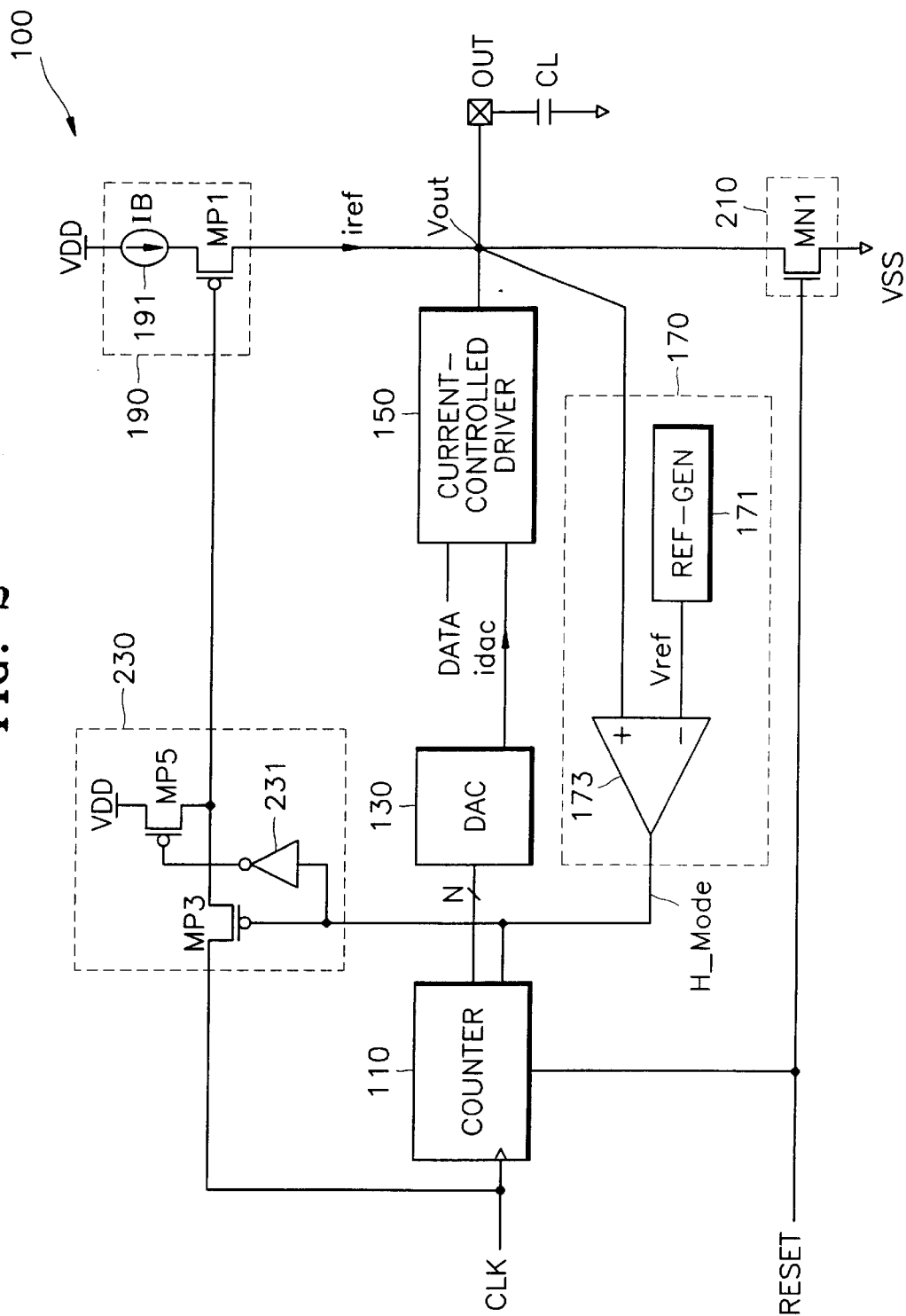
FIG. 2 is a block diagram of a digitally controlled adaptive driver according to an embodiment of the present invention.

FIG. 2 is a block diagram of a digitally controlled adaptive driver according to an embodiment of the present invention. Referring to FIG. 2, an adaptive driver 100 comprises a counter 110, a digital-to-analog converter (DAC) 130, a current-controlled driver 150, a control signal generating circuit 170, a charge pump circuit 190, a discharging circuit 210, and a switching circuit 230.

The counter 110 counts a clock signal (CLK) and outputs an N-bit output signal to the DAC 130 in response to a control signal (H_Mode). The N-bit output signal represents the counted value of the clock signal (CLK). In particular, the counter 110 is reset in response to a reset signal (RESET) and outputs the N-bit output signal to the DAC 130 in response to the control signal (H_Mode) having a first state. The counter 110 may comprise any suitable architecture known in the art.

The DAC 130 converts the N-bit output signal of the counter 110 to an analog signal, for example, current (idac), and outputs the current (idac) to the current-controlled driver 150. The analog signal is directly or inversely proportional to the output signal of the counter 110.

The current-controlled driver 150 receives input signal DATA (that is input via a first input terminal of the current-controlled driver 150) in response to the output signal (idac) of the DAC 130 (that is input via a second input terminal of the current-controlled driver 150). The current-controlled driver 150 preferably increases the driving ability of the input signal DATA in direct or inverse proportion to the output signal (idac) of the DAC 130.

The charge pump circuit 190 supplies charging current (iref) to an external load CL coupled to the output terminal OUT of the adaptive driver 100 in response to the clock signal (CLK). For instance, the charge pump circuit 190 comprises a current source 191 for supplying bias current (IB) to the output terminal OUT and a pull-up circuit MP1 for supplying the bias current (IB) to the output terminal OUT in response to the clock signal (CLK). The current source 191 is coupled between a supply voltage (VDD) and a first terminal of the pull-up circuit MP1. Preferably, the pull-up circuit MP2 comprises a PMOS transistor MP2, wherein the second terminal thereof is coupled to the output terminal OUT and the clock signal (CLK) is supplied to the gate thereof.

The control signal generating circuit 170 automatically detects the voltage (Vout) of the output terminal OUT and outputs the control signal (H_Mode) for controlling the operation of the counter 110 and the switching circuit 230. The control signal generating circuit 170 comprises a reference voltage generating circuit (REF-GEN) 171 for generating a predetermined reference voltage (Vref) and a comparing circuit 173. The comparing circuit 173 comprises a first input terminal for receiving the voltage (Vout) of the output terminal OUT, a second input terminal for receiving the reference voltage (Vref), and an output terminal. The comparing circuit 173 compares the voltage (Vout) of the output terminal OUT with the reference voltage (Vref) of the reference voltage generating circuit 171 and outputs the compared result to the counter 110 and the switching circuit 230 as the control signal (H_Mode).

The discharging circuit 210 comprises a transistor MN1 having a gate connected to the reset signal (RESET), a first terminal coupled to the output terminal OUT, and a second terminal coupled to a ground voltage (VSS). The discharging circuit 210 pulls down the voltage (Vout) of the output terminal OUT to the ground voltage (VSS) in response to the reset signal (RESET), thereby initializing the external load CL.

The switching circuit 230 comprises transistors MP3 and MP5 and an inversion circuit 231 and is controlled by the control signal (H_Mode). For instance, when the control signal (H_Mode) has the first state (for example, a logic value of 'high'), the transistor MP3 turns off, and the transistor MP5 turns on in response to an output signal of the inversion circuit 231, thereby disabling the switching circuit 230. When the transistor MP5 is turned on, the transistor MP1 of the charge pump circuit 190 turns off, thereby disabling the charge pump circuit 190.

Figure 3:
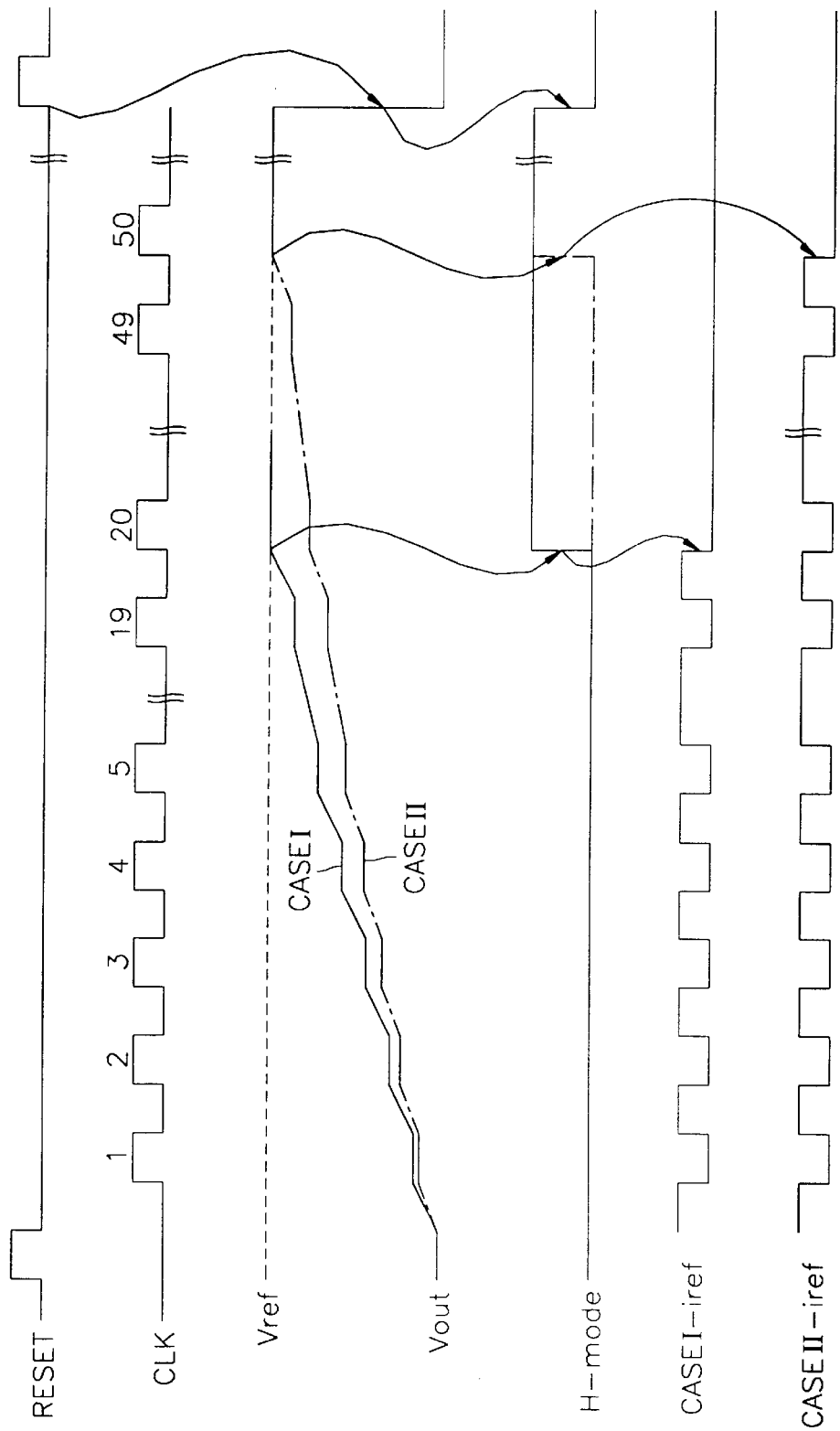
FIG. 3 is a diagram illustrating output waveforms of a digitally controlled adaptive driver according to an embodiment of the present invention.

FIG. 3 is a diagram illustrating output waveforms of a digitally controlled adaptive driver according to an embodiment of the present invention. Referring to FIGS. 2 and 3, in response to the enabling of a reset signal (RESET), a counter 110 is reset, and a discharging circuit 210 discharges the voltage (Vout) of an output terminal OUT to a ground voltage (VSS), thereby initializing an external load CL.

At this time, since the voltage (Vout) of the output terminal OUT is lower than a reference voltage (Vref), the comparing circuit 173 outputs a control signal (H_Mode) having a second state (for example, a logic value of 'low') to the counter 110 and switching circuit 230. The transistor MP3 of the switching circuit 230 turns on in response to the control signal (H_Mode) having the second state, and thus, a transistor MP5 turns off.

On the other hand, in response to the disabling of the reset signal (RESET), a clock signal (CLK) is supplied to the counter 110 and the switching circuit 230. The switching circuit 230 transmits the clock signal (CLK) to a charge pump circuit 190 in response to the control signal (H_Mode) having the second state. The charge pump circuit 190 supplies charging current (iref) to the external load CL coupled to the output terminal OUT in response to the clock signal (CLK). The counter 110 counts the number of cycles of the clock signal (CLK). Preferably, the counter 110 outputs an output signal corresponding to the counted value of the clock signal (CLK) in response to the control signal (H_Mode) having a first state not the control signal (H_Mode) having the second state.

The voltage (Vout) of the output terminal OUT coupled to the external load CL is determined by the number of cycles of the clock signal (CLK), an amount of the charging current (iref), and the value of the external load CL. Thus, the voltage (Vout) of the output terminal OUT increases in proportion to the number of cycles of the clock signal (CLK).

The comparing circuit 173 compares the voltage (Vout) of the output terminal OUT with the reference voltage (Vref), and outputs the control signal (H_Mode) having the first state to the counter 110 and the switching circuit 230 when the voltage (Vout) of the output terminal OUT is larger than the reference voltage (Vref). According to the control signal (H_Mode) having the first state, the transistor MP3 of the switching circuit 230 turns off and the transistor MP5 turns on. Thus, the transistor MP2 of the charge pump circuit turns off.

The counter 110 outputs the N-bit output signal corresponding to the counted value of the clock signal (CLK) in response to the control signal (H_Mode) having the first state. That is, the counter 110 counts the number of cycles of the clock signal (CLK) during the first state of the control signal (H_Mode). The N-bit output signal corresponding to the counted value of the clock signal (CLK) is output to the DAC 130. The DAC 130 converts the N-bit output signal of the counter 110 into an analog signal, for example, current (idac). The current (idac) is proportional to the N bit output signal of the counter 110.

For example, assume that the external load CL is 20 pf, and the number of cycles of the clock signal (CLK) is twenty such that the voltage (Vout) of the output terminal OUT reaches the predetermined reference voltage (Vref) (Case I). In Case I, the charge pump circuit 190 supplies the charging current (iref) to the output terminal OUT during the counter 110 counting 20 cycles of the clock signal (CLK). And thus, the control signal generating circuit 170 outputs the control signal (H_Mode) having the first state after the counter 110 counts the 20 cycles of the clock signal (CLK).

The switching circuit 230 is disabled in response to the control signal (H_Mode) having the first state, thereby disabling the charge pump circuit 190. Then, the counter 110 counts the number of 20 cycles of the clock signal (CLK) in response to the control signal (H_Mode) having the first state and outputs the N-bit output signal corresponding to the 20 cycles of the clock signal (CLK) to the DAC 130. The DAC 130 converts the digital N-bit output signal of the counter 110 into an analog signal, i.e., current (idac). The current-controlled driver 150 drives an input signal DATA into the output terminal OUT in response to the current (idac).

Further, assume that the external load CL is 50 pf, and the number of cycles of the clock signal (CLK) is fifty (50), such that the voltage (Vout) of the output terminal OUT reaches the predetermined reference voltage (Vref) (Case II). In Case II, the control signal generating circuit 170 outputs the control signal (H_Mode) having the first state after the counter 110 counts the 50 cycles of the clock signal (CLK).

The switching circuit 230 is disabled in response to the control signal (H_Mode) having the first state, and thus the charge pump circuit 190 is disabled. Then, the counter 110 counts the 50 cycles of the clock signal (CLK) in response to the control signal (H_Mode) having the first state and outputs the N-bit output signal corresponding to the 50 cycles of the clock signal (CLK) to the DAC 130. The DAC 130 converts the N-bit output signal of the counter 110 into an analog signal, i.e., current (idac). The current-controlled driver 150 drives the input signal DATA into the output terminal OUT in response to the current (idac). The current (idac) of the DAC 130 is in proportion to the N-bit output signal of the counter 110. Further, the current-controlled driver 150 increases the driving ability of the input signal DATA in proportion to the output signal (idac) of the DAC 130.

Since the current (idac) in Case II (in which the external load CL coupled to the output terminal OUT is 50 pf) is larger than the current (idac) in Case I (in which the external load CL coupled to the output terminal OUT is 20 pf), the driving ability of the current-controlled driver 150 in Case II is larger than the driving ability of the current-controlled driver 150 in Case I.

Advantageously, because a digitally controlled adaptive driver according to an embodiment of the present invention measures the capacitance of an external load via a charge pump circuit and a counter, the driver can vary the driving ability of an input signal DATA of a current-controlled driver in response to the counted value of the clock signal (CLK) by the counter. Thus, the digitally controlled adaptive driver has a constant rise time and fall time regardless of the variation of the external load.

Further, since a digitally controlled adaptive driver according to the present invention drives the external load coupled to an output terminal at constant output speed of an input signal, the driver can automatically sense the external load, thereby self-controlling the current driving ability of the driver. Furthermore, the current driving ability of a digitally controlled adaptive driver according to the present invention is properly controlled based on the value of the external load coupled to an output terminal, thereby exactly controlling the driver.

As described above, a digitally controlled adaptive driver according to an embodiment of the present invention can drive an input signal at constant output speed and, simultaneously, drive the external load coupled to an output terminal. Thus, the digitally controlled adaptive driver automatically senses the external load and self-controls the current driving ability of the driver.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A digitally controlled adaptive driver, comprising:
   a load sensing circuit for sensing a voltage of an output terminal of the driver connected to a load and for generating a control signal in response to the voltage of the output terminal; and
   a control driver for digitally determining a value of the load based on a count signal that is output in response to the control signal of the load sensing circuit, the count signal indicating a number of cycles of a clock signal in which a reference current is applied to the output terminal to charge the voltage of the output terminal to a reference voltage, and for controlling a driving current for driving an input signal in response to the value of the load.

2. The driver of claim 1, further comprising a charge pump circuit for supplying the reference current to the output terminal in response to the clock signal.

3. The driver of claim 1, wherein the load sensing circuit comprises:
   a reference voltage generator for generating the reference voltage; and
   a comparator for comparing the reference voltage of the reference voltage generator with the voltage of the output terminal and for outputting the comparison result as the control signal, wherein the control signal comprises a first state when the voltage of the output terminal is larger than the reference voltage, and the control signal comprises a second state when the reference voltage is larger than the voltage of the output terminal.

4. The driver of claim 3, wherein the control driver comprises:
   a counter for counting the number of cycles of a clock signal and for outputting the count signal corresponding to the number of cycles of response to the control signal having the first state;
   a digital-to-analog converter (DAC) for converting the count signal into the driving current; and a driver for driving the input signal to the output terminal in response to the driving current.

5. The driver of claim 4, wherein the counter is reset in response to a reset signal, and the output terminal is initialized in response to the reset signal.

6. A digitally controlled adaptive driver, comprising:

a charge pump circuit for supplying a predetermined current to an output terminal of the driver in response to a clock signal;

a counter for counting the number of cycles of the clock signal and for outputting a count signal corresponding to the number of counted cycles of the clock signal;

a driver for driving an input signal to the output terminal in response to the count signal; and a control signal generator for comparing the voltage of the output terminal with a reference voltage to generate a control signal;

wherein the control signal has a first state when the voltage of the output terminal is larger than the reference voltage, and the control signal has the second state when the reference voltage is larger than the voltage of the output terminal;

wherein the charge pump circuit is enabled in response to the second state of the control signal, and wherein the counter outputs the count signal in response to the first state of the control signal.

7. The driver of claim 6, further comprising a converter for converting the count signal of the counter into an analog signal, wherein the driver controls the driving of the input signal to the output terminal based on the analog signal.

8. The driver of claim 6, wherein the control signal generator comprises:

a reference voltage generator for generating the reference voltage; and a comparator for comparing the reference voltage with the voltage of the output terminal to generate the control signal.

9. The driver of claim 6, wherein the counter is reset in response to a reset signal, and the output terminal is pulled-down to a ground voltage in response to the reset signal.

10. A method for driving a signal, comprising:

sensing a voltage of an output terminal connected to a load;

generating a control signal based on the sensed voltage;

digitally measuring the load based on a count signal that is output in response to the control signal, the count signal indicating a number of cycles of a clock signal in which a reference current is applied to the output terminal to charge the voltage of the output terminal to a reference voltage; and adaptively controlling a driving current in response to the value of the load to drive an input signal to the output terminal.

11. The method of claim 10, further comprising:

supplying the reference current to the output terminal in response to a clock signal when the voltage of the output terminal is lower than a predetermined value.

12. The method of claim 10, further comprising the step of:

initializing the value of the output terminal in response to a reset signal.

13. The method of claim 10, wherein the step of generating the control signal comprises:

generating the reference voltage;

comparing the reference voltage with the voltage of the output terminal;

generating the control signal having a first state when the voltage of the output terminal is larger than the reference voltage, and the control signal having a second state when the reference voltage is larger than the voltage of the output terminal.

14. The method of claim 13, wherein the step of digitally measuring the load comprises:

counting the number of cycles of a clock signal and outputting the count signal indicating the number of cycles of the clock signal, in response of the first state of the control signal;

converting the count signal into an analog signal; and driving the input signal to the output terminal in response to the analog signal.

15. The method of claim 14, further comprising:

initializing the counting of the number of cycles of the clock signal in response to a reset signal.

16. The method of claim 14, wherein the analog signal is the current for driving the input signal to the output terminal.

* * * * *